United States Patent [19]

Claussen et al.

[11] Patent Number: 4,492,778
[45] Date of Patent: Jan. 8, 1985

[54] METHOD FOR MAKING FLUORESCENT LIGHT-COLLECTORS

[75] Inventors: Uwe Claussen, Leverkusen; Josef Merten, Korschenbroich; Harry Röhr, Frechen; Bernd Melchior, Remscheid, all of Fed. Rep. of Germany

[73] Assignee: Bayer Aktiengesellschaft, Leverkusen-Bayerwerk, Fed. Rep. of Germany

[21] Appl. No.: 533,126

[22] Filed: Sep. 19, 1983

[30] Foreign Application Priority Data

Sep. 30, 1982 [DE] Fed. Rep. of Germany ....... 3236241

[51] Int. Cl.³ ...................... G21K 1/10; H01L 31/04; G21F 1/10
[52] U.S. Cl. .................................. 523/137; 136/247; 252/301.35

[58] Field of Search ................ 136/247, 259; 250/227, 250/483.1, 484.1, 486.1, 487.1, 488.1; 350/96.10; 523/137; 252/301.35

[56] References Cited

U.S. PATENT DOCUMENTS 4,260,219 4/1981 Greubel et al. .................. 350/96.10

Primary Examiner—Aaron Weisstuch
Attorney, Agent, or Firm—Connolly and Hutz

[57] ABSTRACT

A method for making a light-collector of a transparent plastic and a fluorescent dye, wherein the monomers forming transparent plastics are mass-prepolymerized in the presence of radical catalysts and the fluorescent dye is added before, during or at the end of prepolymerization, and then polymerizing the mixture to completion by adding another catalyst, also at pressures of from 2 to 20 bars and at temperatures of from 50° to 160° C., and the use of the light-collector thus produced in combination with photovoltaic elements, preferably based on Ga/As or Si.

2 Claims, No Drawings

METHOD FOR MAKING FLUORESCENT LIGHT-COLLECTORS

This invention relates to a method for making light collectors of a transparent plastic doped with fluorescent, sunlight-absorbing substances.

Light collectors, for example in the form of panels of a transparent plastic containing fluorescent dyes, for collecting direct or diffuse light are known in principle (cf. DE-OS No. 26 20 115, U.S. Pat. No. 4,149,902 and Solar Cells 4 (1981), 3-23).

The utility value of light collectors of this type is determined by their energy efficiency level, i.e. the ratio of useful electrical energy obtained to the energy of the incident light. The energy efficiency level depends inter alia upon the reflecting power of the collector surface, upon the absorption of the light by the dye, upon the dispersion of the light emitted by the reabsorption or by optical inhomogeneities in the matrix and upon losses during conversion of the light into electricity.

In the case of light collectors containing fluorescent dyes, the loss of intensity of the fluorescent light during transport from the panel is particularly critical at its edge. In this respect dye purity and as high a band separation as possible are particularly favorable conditions.

The dyes may be adequately purified, for example, by fractional crystallization, by adsorption or by distribution chromatography on solid or liquid supports. In contrast, band separation depends to a large extent on the properties of the medium surrounding the dyes. For example, attempts have been made to improve band separation by introducing low molecular weight additives (Appl. Phys. 23, 369 (1980). In that case, however, the life of the light collector is reduced by bleeding out of the low molecular weight additive or by light-induced reactions to such an extent that it can no longer be used in practice. The standard incorporation of dyes into plastics by extrusion results in products having only moderate properties which are also of no practical value.

The present invention provides a method for making a light-collector from a transparent plastic containing a fluorescent dye, characterized in that monomers forming transparent plastics are mass-prepolymerized at temperatures of from 50° to 160° C. and under pressures of from 2 to 20 bars with the aid of percarbonates, acyl sulfonyl peroxides, perketones or azodiiso butyric acid esters as radical initiators and the fluorescent dye is added either before, during or at the end of prepolymerization, and the mixture is then polymerized to completion by adding another catalyst out of the group of percarbonates, acyl sulfonyl peroxides, perketones, azoisobutyronitrile or azoisobutyric acid esters, hydroperoxides and perketals, also under pressures of from 2 to 20 bars and at temperatures of from 50° to 160° C.

It is preferred to use a two-stage mass polymerization process in which a prepolymer is first prepared and then polymerized to completion, optionally following the addition of another catalyst.

Compared with conventionally made products, the light collectors obtained by the method according to the invention have a higher emission for the same extinction, i.e. an improved energy efficiency level and a longer useful life.

For a given concentration, the fluorescence of a dye incorporated in a polymeric matrix is maintained for a longer period, the longer the emission wavelength. The increase in the duration of fluorescence is greater where the fluorescence and absorption bands overlap than in the long-wave region of the emission where fluorescence lasts for between about 2 and 10 nsec., depending on the dye. In the light collectors according to the invention, the emission abatement curve is monoexponential at all emission wavelengths, i.e. only one emitting condition can be detected. After 100 h exposure to the light of a xenon lamp, the fluorescent life is reduced by at most 10%. This may be determined by means of ultra-short-time spectra recorded with a commercial instrument, for example of the type manufactured by the Ortec Company.

The polymerization reaction required for producing the light collectors is carried out in two stages. In the two-stage reaction, the monomers are first prepolymerized. Suitable catalysts for this first stage are percarbonates, acyl sulfonyl peroxides, perketones and azodiisobutyric acid esters. The fluorescent dye is added before, during, or at the end of this prepolymerization stage, i.e. before commencement of the second polymerization stage, after which the prepolymer formed is polymerized to completion after the addition of another catalyst. Particularly suitable catalysts for this stage are percarbonates, acyl sulfonyl peroxides, perketones, azoisobutyronitrile or azoisobutyric acid esters, hydroperoxides and perketals.

The quantity of catalyst used is between 0.1 and 0.001% by weight and preferably 0.01% by weight, based on monomer, for each stage. Suitable polymers are those which are permeable with hardly any losses to light having a wavelength of from 300 to 1000 nm, for example homopolymers and copolymers of acrylic acid, methacrylic acid, styrene or styrene/acrylonitrile. Esters of acrylic and methacrylic acid are preferred. Particularly suitable acrylic polymers have a residual monomer content of less than 0.5%, a Schultz' inconsistency factor $U_n$ of 1, a number-average molecular weight $M_n$ of ~200,000 g/mol, a weight-average molecular weight $M_w$ of ~400,000 g/mol, a Staudinger index [M] of 1.5 dl/g and minimal long chain branching.

It is necessary to apply a pressure of from 2 to 20 bars during polymerization at temperatures in the range from 50° C. to 160° C. Pressures in the range from 8 to 12 bars and temperatures in the range from 80° C. to 140° C. are particularly suitable.

The fluorescent dyes suitable for use in accordance with the invention are characterised by a high Stokes shift. Particularly suitable dyes are dyes of the thioxanthene or coumarin series or derivatives of perylene or boron complexes, of the type described for example in DE-OS Nos. 28 51 513, 28 17 456, 30 01 877, 29 52 228, 29 37 422, 26 07 968, in FR-PS No. 1,488,113 and in EP-PS No. 4665.

The quantity of dye used amounts to between 0.001 and 0.5% by weight, based on the polymer, and preferably to between 0.01 and 0.1% by weight or to between ~$10^{-3}$ and $10^{-4}$ moles.

The light collectors may be produced with the aid of auxiliaries known per se for improving polymerization, for example butyl acrylate or ethylene glycol dimethacrylate. It is advantageous to use neutral or acid compounds for this purpose. Advantages are afforded by the incorporation of (meth)acrylic acid in quantities of up to 5% or by the simultaneous presence of paraffin carboxylic acids, such as stearic acid, sulfimides or styrene sulfonic acids. They are best added in quantities of from 0.01 to 5%.

The light collector panels may be used in conjunction with photovoltaic elements for utilising solar energy. In principle, any photovoltaic element may be used for converting the concentrated light into electricity providing its conductivity band overlaps the emission range of the solid. Si or Ga-As-cells are particularly suitable. An optimal effect is obtained where the photovoltaic element and the dye are co-ordinated with one another. A particularly preferred combination is the Ga-As-cell with orange-yellow fluorescent dyes from the perylene tetracarboxylic acid diimide series or with red fluorescent dyes from the coumarin or thioxanthene series. In addition, they are suitable in conjunction with electronic controls as indicating systems having a very low energy consumption or, without electronic components, for a variety of indicating, information, and marking functions, for example in passive indicating elements, information and traffic signs, such as traffic lights.

The light collectors according to the invention are used predominantly in the form of panels, although they may also assume other geometric forms.

The light collectors according to the invention are distinguished by particularly good photoconductivity and by high stabilization of the dyes, which two properties are essential to practical application. The material according to the invention is injection-mouldable. Its favorable optical and spectral properties are only minimally affected by injection moulding and are distinctly better than those of products made by conventional methods.

EXAMPLES

Example 1

(a) 110 g of methyl methacrylate are prepolymerized with 0.1% of azobis-(ethylisobutyrate) at 95° C. up to a viscosity of approximately 1000 cp. 11 mg of tetrachloro-N-methylperylene tetracarboxylic acid diimide are then added, provision being made for complete dissolution and intermixing, and the reaction is completed at 140° C./10 bar following the addition of 11 mg of bis-(cyclohexyl)-percarbonate and 11 mg of azobisbutyronitrile. A glass-clear, yellow fluorescent product having the following data (column 1) is obtained.

|  | 1. | 2. |  |
| --- | --- | --- | --- |
| Staudinger index | 0.97 | 1.40 | dl/g |
| $M_n$ | 178,000 | 258,000 | g/mol |
| $M_w$ | 413.000 | 389,000 | g/mol |
| Inconsistency | 1.3 | 0.51 |  |
| Residual monomer | <0.5% | <0.5% |  |

(b) If, in the procedure described above, 5% of butyl acrylate and 0.1% of methacrylic acid are added to the prepolymer, a product having the data shown in column 2 is obtained.

Example 2

110 g of methyl methacrylate are prepolymerized with 0.1% of azobisisobutyrate in the presence of 11 mg of 3-benzthiazolyl-4-cyano-7-diethylaminocoumarin until a viscosity of approximately 1000 cp is reached. 0.1% of methylisopropyl perketone is then added and the reaction is completed at 140° C./10 bars.

A clear deep-red fluorescent material is obtained in which the dye shows a fluorescent life of 8.35 nsec in the emission maximum at 594 nm. The same dye in the same concentration in standard commercial granulate has a fluorescent life of 6.98 nsec; the absolute integrated fluorescence amounts to $4.16 \cdot 10^5$ cts/sec.

Example 3

5 kg of the material obtained in accordance with Example (1a) are broken up and graded to a particle size of 5 mm. The granulate obtained in injection-moulded to form small panels measuring 50×30×2 mm. Their spectroscopic properties are shown in Table 1, line 1. The spectroscopic data of the material according to Example (1a) without injection moulding are shown in line 2.

For comparision, the same dye is applied in the same quantity to polymethyl methacrylate (Rohm's Plexiglas N7), the product injection-moulded (line 3), broken up again and re-injection-moulded (line 4).

The two pairs of specimens have the following properties:

TABLE 1

| Absorption extinction | Wave number | Emission abs. intensity | integration range |
| --- | --- | --- | --- |
| 1  1.03 | 18 100 | $3.47 \cdot 10^5$ | 19 000– |
| 2  0.96 | 18 100 | $3.56 \cdot 10^5$ | 12 500 cm$^{-1}$ |
| 3  1.09 | 18 100 | $3.20 \cdot 10^5$ |  |
| 4  1.09 | 18 100 | $3.08 \cdot 10^5$ |  |

It can be seen that injection moulding has little effect on material 2 but a marked effect on comparison material 3. Material 2 according to the invention is better by about 20% than material 3, which is conventional material.

Example 4

The same procedure is employed as described in Example 2 and the following are used as dyes:
1. 3-(5-chloro)-benzoxazolyl-4-cyano-7-diethylaminocoumarin (Dye A);
2. 3-(5-methoxy)-benzthiazolyl-7-phenylsulphamidocoumarin (Dye B);
3. perylene-3,9-dicarboxylic acid isobutyl ester (Dye C) and
4. 3-(5-methoxy)-benzthiazolyl-4-cyano-7-methoxycoumarin (Dye D).

By way of comparison, Dyes A–D were incorporated without the use of pressure by conventional polymerization process and the heat of reaction was dissipated by water cooling.

Two batches of glass-clear, deeply coloured polymers are obtained from which specimens were cut which were 1 m long, 5 cm wide, and 3 cm thick. These are polished on one narrow side and connected to a photocell. When the sample strip is completely covered the cell does not indicate any electric current. If the cover is removed towards one side, so that light of constant intensity falls on the surface of the specimen, the photoelectric current in the detector increases continuously as the collecting area becomes larger. The measured photoelectric current, when plotted against the free illuminated surface, produces an intensity path graph which can be represented by the equation $\ln I(X) = \ln I_o - \alpha X$. I is the photoelectric current measured, $I_o$ is the photoelectric current at an infinite bar length, $\alpha$ is a damping coefficient and X is the uncovered path length. By known mathematical processes it is possible to calculate $I_o$ and $\alpha$ by curve fitting.

The following results are obtained:

| Dye | Process according to the invention | | comparison | |
| --- | --- | --- | --- | --- |
|  | $I_o$ | $\alpha$ | $I_o$ | $\alpha$ |
| A | 41.2 | 0.034 | 37.4 | 0.041 |
| B | 16.0 | 0.035 | 14.2 | 0.040 |
| C | 22.7 | 0.036 | 18.6 | 0.041 |
| D | 28.1 | 0.032 | 26.6 | 0.041 |

It can be seen that the material produced by the process according to the invention has both lower damping coefficients and a higher $I_o$-value.

We claim:

1. A method for making a light-collector from a transparent plastic containing a fluorescent dye, wherein the monomers forming transparent plastics are mass-prepolymerized at temperatures of from 50° to 160° C. and under pressures of from 2 to 20 bars using a radical catalyst from the group consisting of percarbonates, acyl sulfonyl peroxides, perketones, or azodiiso butyric acid esters, and the fluorescent dye is added either before, during, or at the end of prepolymerization, and the mixture is then polymerized to completion after adding another catalyst from the group consisting of percarbonates, acyl sulfonyl peroxides, perketones, azoisobutyronitrile or azoisobutyric acid esters, hydroperoxides, and perketals, also under pressures of from 2 to 20 bars and at temperatures of from 50° to 160° C.

2. A method as claimed in claim 1, wherein coumarin derivatives or perylene compounds are used as the dye.

* * * * *